(12) United States Patent
Wilhide et al.

(10) Patent No.: US 11,431,177 B2
(45) Date of Patent: Aug. 30, 2022

(54) HYBRID ENERGY STORAGE MODULE SYSTEMS AND METHODS OF DISCHARGING ENERGY STORAGE MODULES

(71) Applicant: Hamilton Sundstrand Corporation, Charlotte, NC (US)

(72) Inventors: Matthew L. Wilhide, Cherry Valley, IL (US); Christopher J. Courtney, Janesville, WI (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 961 days.

(21) Appl. No.: 15/921,292

(22) Filed: Mar. 14, 2018

(65) Prior Publication Data

US 2019/0288521 A1    Sep. 19, 2019

(51) Int. Cl.
  *H02J 7/00*  (2006.01)
  *H02J 1/10*  (2006.01)
  *H02J 1/08*  (2006.01)
  *B60L 58/22* (2019.01)
  *H02J 7/34*  (2006.01)
  *H03H 7/06*  (2006.01)

(52) U.S. Cl.
  CPC ............ *H02J 7/0016* (2013.01); *B60L 58/22* (2019.02); *H02J 1/08* (2013.01); *H02J 1/10* (2013.01); *H02J 7/0013* (2013.01); *H02J 7/0014* (2013.01); *H02J 1/106* (2020.01); *H02J 7/345* (2013.01); *H03H 7/06* (2013.01)

(58) Field of Classification Search
  CPC .................................................... H02J 9/0016
  USPC ......................................................... 320/118
  See application file for complete search history.

(56) References Cited

U.S. PATENT DOCUMENTS

| 8,427,108 B2* | 4/2013 | Swenson | H02J 7/34 320/128 |
| 8,796,884 B2* | 8/2014 | Naiknaware | H02J 3/385 307/102 |
| 9,450,274 B2 | 9/2016 | Vo et al. | |

(Continued)

FOREIGN PATENT DOCUMENTS

WO    WO-2012144399 A1    10/2012

OTHER PUBLICATIONS

Extended European Search Report for European Patent Application No. EP19162645.6, dated May 8, 2019.

(Continued)

*Primary Examiner* — Yalkew Fantu
(74) *Attorney, Agent, or Firm* — Locke Lord LLP; Scott D. Wofsy; Judy R. Naamat (57) ABSTRACT

A hybrid energy storage module system includes a first power stage having a short circuit switch to connect the first power stage to a power bus, a second power stage stacked in series with the first power stage and having a short circuit switch to connect the second power stage to the power bus, and a controller. The controller is operably connected to the first and second power stage short circuit switches to discharge one of the first and second power stage through the other of the first and second power stage in a state of charge balancing mode. Aircraft electrical systems and methods of controlling connectivity of hybrid energy storage modules to electrical systems are also described.

18 Claims, 5 Drawing Sheets

(56) References Cited

U.S. PATENT DOCUMENTS 10,615,610 B1 * 4/2020 Jelinek .................. H02J 7/0021
2017/0057363 A1 3/2017 Huh et al.

OTHER PUBLICATIONS

Office Action from the European Patent Office for European Patent No. EP19162645.6, dated Nov. 5, 2021.

Zheng Huiping et al: "A control strategy of hybrid energy storage system in bipolar-type DC micro-grid", 2017 IEEE Conference on Energy Internet and Energy System Integration (EI2), IEEE, Nov. 26, 2017 (Nov. 26, 2017), pp. 1-6, XP033288331, DOI: 10.1109/EI2.2017.8245594 [retrieved on Jan. 2, 2018].

* cited by examiner

| | FIRST HESM SHORT CIRCUIT SWITCH | SECOND HESM SHORT CIRCUIT SWITCH |
|---|---|---|
| ABSORB/SOURCE MODE 210 | CLOSED | CLOSED |
| DISCHARGE MODE 230 | OPEN | CLOSED |
| SHORT DETECTED MODE 220 | CLOSED | OPEN |
| | OPEN | OPEN |
| BALANCE MODE 240 | OPEN | CLOSED |
| | CLOSED | OPEN |

HYBRID ENERGY STORAGE MODULE SYSTEMS AND METHODS OF DISCHARGING ENERGY STORAGE MODULES

BACKGROUND OF THE INVENTION

1. Field of the Invention

The present disclosure relates to electrical systems, and more particularly to systems and methods for balancing state of charge of energy storage modules in electrical systems.

2. Description of Related Art

Electrical systems commonly include power storage devices for supplying power to and receiving power from the electrical system. Some electrical systems have power storage devices of different types, the different types of power storage devices accommodating different operating conditions of the electrical system. Such hybrid power storage device arrangements can include power storage devices grouped by type and connected to the electrical system in stages, the stacked modules absorbing and sourcing pulses to the electrical system, as required.

In some electrical systems the efficiency of the energy storage modules within a stack can vary relative to one another. The variation in efficiency can, in some electrical systems, cause the state of charge of the power storage devices within the stack to diverge from one another. The state of charge divergence can accumulate such that an overvoltage condition, requiring that a power storage device or entire stack be disconnected until state of charge is rebalanced. While the state of charge is unbalanced, and the power storage device and/or stack disconnected, operation can of the electrical system can limited as the energy storage module and/or stack functionality is unavailable.

Such conventional methods and systems have generally been considered satisfactory for their intended purpose. However, there is still a need for improved power stages stacks and methods of balancing state of charge. The present disclosure provides a solution for this need.

SUMMARY OF THE INVENTION

A hybrid energy storage module (HESM) system includes a first power stage, at least one second power stage, and a controller. The first power stage has a short circuit switch to connect the first power stage to a power bus. The at least one second power stage is stacked in series with the first power stage and having a short circuit switch to connect the second power stage to the power bus. The controller is operably connected to the first and second power stage short circuit switches to discharge one of the first and second power stage through the other of the first and second power stage in a state of charge (SOC) balancing mode.

In certain embodiments, one of the first power stage short circuit switch and the second power stage short circuit switch can be is closed in the SOC balancing mode. One of the one of the first power stage short circuit switch and the second power stage short circuit switch can be open in the SOC balancing mode. One of the first and second power stage short circuit switches can be closed and the other of the first and second power stage short circuit switches can be open when the controller is in the SOC balancing mode.

In accordance with certain embodiments the controller can have a short circuit mode to disconnect an energy storage module (ESM) of the first power stage and an ESM of the second ESM from the power bus. Both the first and second power stage short circuit switches can be open in the short circuit mode. The controller can have a discharge mode to discharge either (or both) the first and the second power stage through the power bus. One of the first and second power stage short circuit switches can be closed and the other of the first and second power stage short circuit switches can be open in the SOC balancing mode.

It is contemplated that the controller can have an absorb/source mode to absorb and provide current pulses to the power bus. Both the first and second power stage short circuit switches can be closed in the absorb/source mode. The HESM can include a battery, a supercapacitor or a fuel cell.

It is also contemplated that, in accordance with certain embodiments, HESM system can include a positive rail lead connecting the first power stage to a positive rail of a power bus, a negative rail lead connecting the second power stage to a negative rail of the power, and a neutral rail lead connecting the first power stage and the second power stage to a neutral rail the power bus through a y-lead. The first and/or the second power stage can include an energy storage module (ESM), a direct current/direct current (DC/DC) converter connected in series to the ESM, a power filter connected in series to the DC/DC converter, and a neutral lead connecting the power filter to the second power stage.

In further embodiments the power filter of the HESM system can include a differential filter inductor circuit. The differential filter inductor circuit can include a switch circuit with the short circuit switch. The power filter can include a positive ESM lead and a negative ESM lead, an inductor connected to the positive ESM lead by the short circuit switch, and a diode connecting the negative ESM lead to a node between the inductor and the short circuit switch, the diode arranged to oppose current flow from the positive ESM lead to the negative ESM lead.

An electrical system for an aircraft includes a power bus with a positive rail, a negative rail, and a neutral rail and a HESM system as described above. The first power stage is connected to the positive rail and the neutral rail. The second power stage is connected to the negative rail and the neutral rail.

A method of controlling connectivity of a HESM as described above includes absorbing/sourcing current flow to power bus from the first and second power stage and balancing SOC between the first power stage and the second power stage by connecting one of the first and second power stage through the other of the first and second power stage with the other of the first and second power stage disconnected from the power bus. In certain embodiments the method can also include disconnecting the first and second power stage from the power bus responsive to detecting a short circuit in the power bus. In accordance with certain embodiments the method can include discharging, in full, at least one of the first and second power stage by connecting one of the first and second power stage through the other of the first and second power stage with the other of the first and second power stage disconnected from the power bus.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
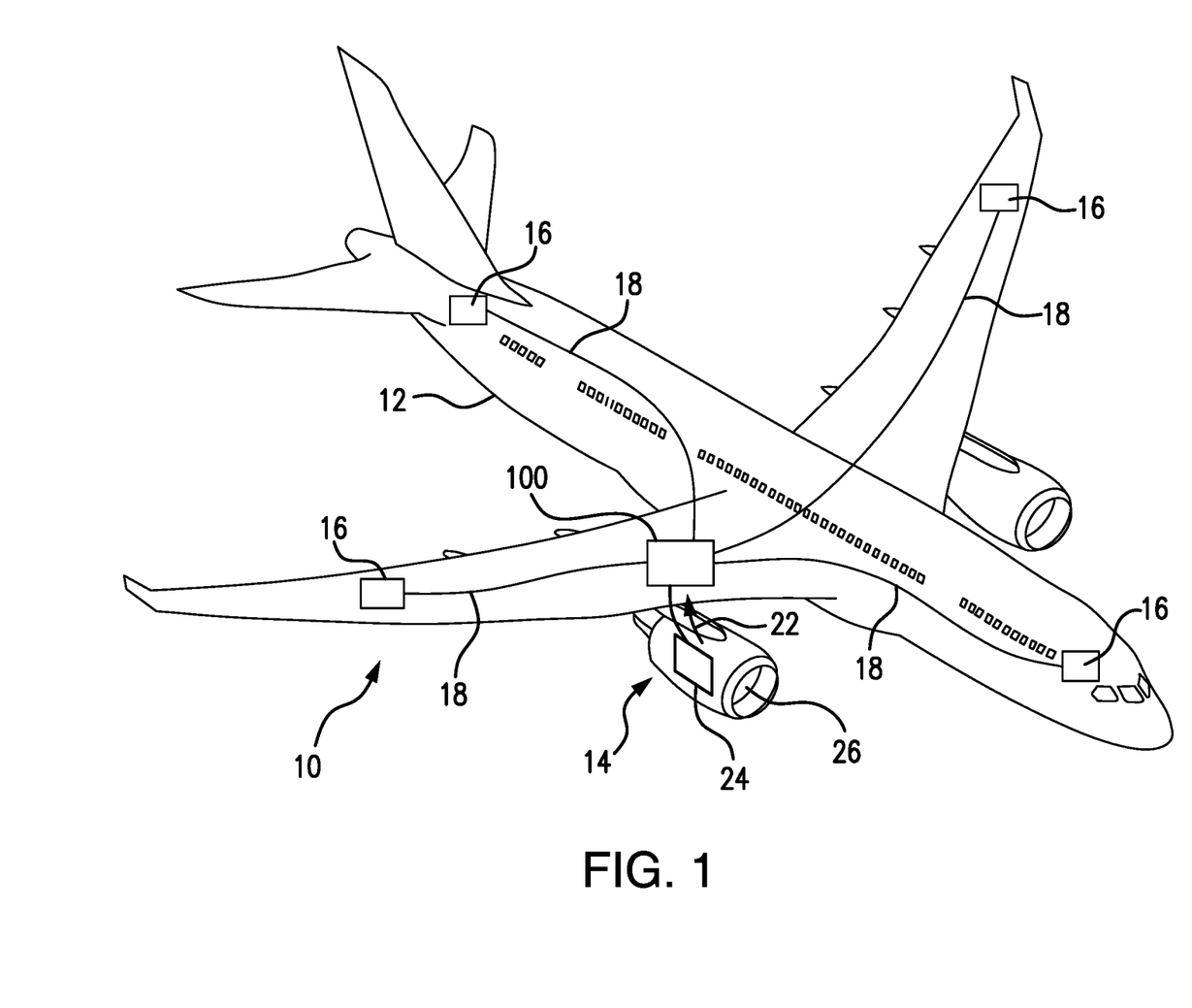
FIG. 1 is a schematic view of an exemplary embodiment of an electrical system constructed in accordance with the present disclosure, showing a hybrid energy storage module (HESM) system connected to an aircraft electrical system.

Reference will now be made to the drawings wherein like reference numerals identify similar structural features or aspects of the subject disclosure. For purposes of explanation and illustration, and not limitation, a partial view of an exemplary embodiment of a hybrid energy storage module (HESM) system in accordance with the disclosure is shown in FIG. 1 and is designated generally by reference character 100. Other embodiments of HESM systems, electrical systems with HESM systems, and methods of controlling connectivity HESM system powers stages to electrical systems in accordance with the disclosure, or aspects thereof, are provided in FIGS. 2-6, as will be described. The systems and methods described herein can be used in high voltage direct current (HVDC) electrical systems, such as in aircraft, though the present disclosure is not limited to aircraft electrical systems or to HVDC electrical systems.

Referring to FIG. 1, an electrical system 10 for a vehicle, e.g., an aircraft 12, is shown. Electrical system 10 includes a power source 14 connected to one or more power consuming devices 16 by a power bus 18. Power bus 18 is connected to the one or more power consuming devices 16 through a power distribution panel 20 for controlling the flow of HVDC power 22 to the one or more power consuming devices 16 carried by aircraft. HESM system 100 is electrically connected to power bus 18 to control variation of HVDC power 22 provided through power bus 18, e.g., to limit voltage variation and/or current flow due to the connection and disconnection of power-consuming devices 16 to and from power bus 18 during operation. As used herein the term high voltage refers to electrical systems having a bus voltage that is greater than 270 volts, e.g., electrical systems having 600 volt power buses.

In the illustrated exemplary embodiment power source 14 includes a generator 24 which is connected to power bus 18 and coupled to an aircraft main engine 26, which is arranged to apply mechanical rotation to generator 24 for generating the flow of HVDC power 22 provided to power bus 18. This is for illustration purposes only and non-limiting. In certain embodiments power source 14 can include an auxiliary power unit, backup power supply, or a ground power source, as suitable for an intended application.

Figure 2:
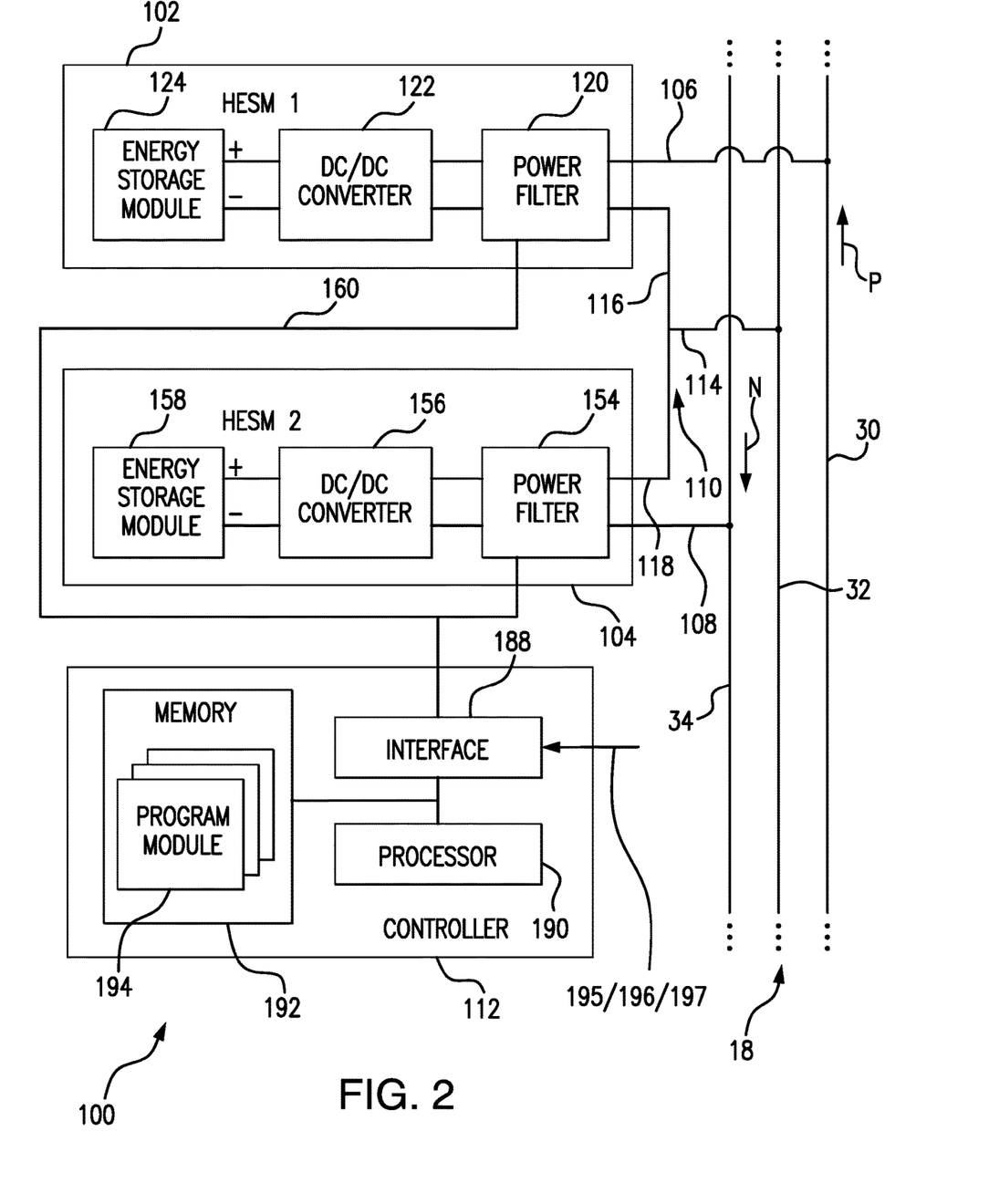
FIG. 2 is a schematic view of the HESM system of FIG. 1, showing the HESM system connected to a power bus of the electrical system, connectivity of the HESM system to the power bus controlled by a controller.

Referring to FIG. 2, power bus 18 and HESM system 100 are shown. Power bus 18 is a split DC bus having a positive rail 30, a neutral rail 32 and a negative rail 34. Connectivity of power bus 18 to power source 14 (shown in FIG. 1) provides a positive voltage (potential difference) across positive rail 30 and neutral rail 32 with a magnitude that is substantially equivalent to a negative voltage (potential difference) across negative rail 34 and neutral rail 32, the voltage of power bus 18 being twice the magnitude of each voltage (potential difference). In certain embodiments the voltage is a HVDC that is greater than 28 volts. For example positive rail 30 can have a potential of about positive 300 volts, neural rail 32 can be at about zero volts, and negative rail can have a potential that is about negative 300 volts. Although shown in FIG. 2 and described herein as a three-rail DC power bus, it is to be understood and appreciated that the present disclosure can also benefit two-rail systems, such as in vehicle where the chassis serves a neutral rail by way of non-limiting example.

HESM system 100 includes a first power stage 102, a second power stage 104, a positive rail lead 106, a negative rail lead 108, a neutral rail lead 110, and a controller 112. First power stage 102 and second power stage 104 are stacked in series with one another and tied to neutral to perform active filtering of the positive voltage across positive rail 30 and neutral rail 32 and the negative voltage across negative rail 34 and neutral rail 32.

Positive rail lead 106 electrically connects positive rail 30 first power stage 102. Negative rail lead 108 electrically connects negative rail 34 to second power stage 104. Neutral rail lead 110 electrically connects both first power stage 102 and second power stage 104 to neutral rail 32. Neutral rail lead 110 branches to form a y-lead, neutral rail lead 110 having a trunk 114, a first leg 116 and a second leg 118. Trunk 114 is connected to neutral rail 32 on a first end and to both first leg 116 and second leg 118 on an opposite second end. First leg 116 electrically connects first power stage 102 to trunk 114 and second leg 118, and therethrough to neutral rail 32 and negative rail lead 108 via second power stage 104. Second leg 118 electrically connects second power stage 104 trunk 114 and first left 116, and therethrough to neutral rail 32 and positive rail lead 106 via first power stage 102.

First power stage 102 is configured as a buck regulator and includes a power filter 120, a DC/DC converter 122 and an energy storage module (ESM) 124. ESM 124 can include one or more of a battery, a capacitor (e.g., a supercapacitor or an ultracapacitor), or a fuel cell, and is configured an adapted to source/absorb transient current pulses P flowing through positive rail 30 through positive rail lead 106 via DC/DC converter 122 and power filter 120. DC/DC converter 122 electrically connects ESM 124 power filter 120. Power filter 120 electrically connects DC/DC converter 122 to neutral rail lead 110 and positive rail lead 106.

Figure 3:
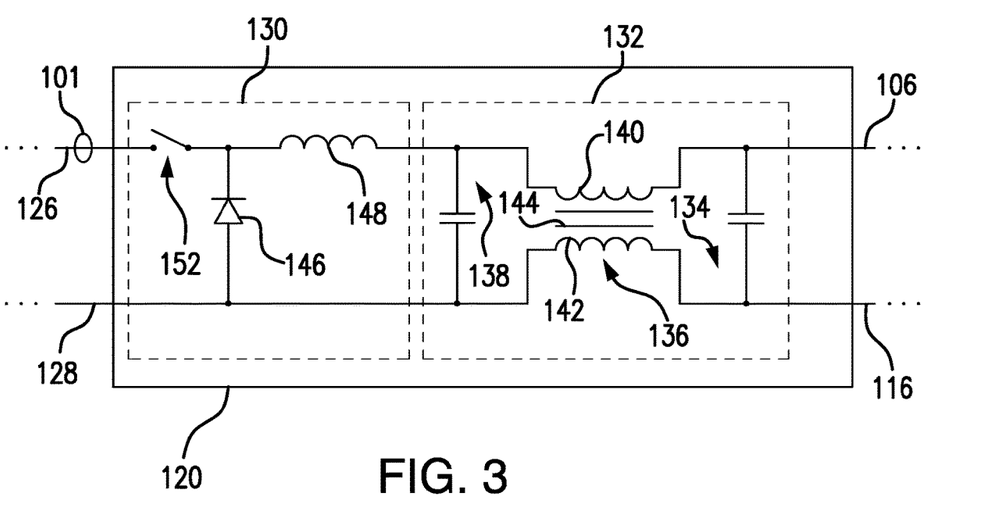
FIG. 3 is schematic view of the a portion of the HESM system of FIG. 1, showing a power filter of a first power stage including a first power stage short circuit switch.

With reference to FIG. 3, power filter 120 is shown. Power filter 120 includes an ESM positive lead 126, an ESM negative lead 128, a switch circuit 130 and a filter circuit 132. Filter circuit 132 connects positive rail lead 106 and neutral rail lead 110 to ESM 124 (shown in FIG. 2) and has a first capacitor 134, a differential filter inductor 136 and a second capacitor 138. First capacitor 134 is connected between positive rail lead 106 and neutral rail lead 110.

Second capacitor 138 is connected between ESM positive lead 126 and ESM negative lead 128.

Differential filter inductor 136 includes a positive winding 140, a neutral winding 142 and a ferrite core 144. Positive winding 140 is connected in series between ESM positive lead 126 and positive rail lead 106 and is electromagnetically coupled to neutral winding 140 via ferrite core 144. Neutral winding 142 is connected in series between ESM negative lead 128 and neutral rail lead 110 and is electromagnetically coupled to positive winding 138 via ferrite core 144. As will be appreciated by those of skill in the art in view of the present disclosure, differential filter inductor 136 operates like a transformer with the difference that power does not flow through differential filter inductor 136.

Switch circuit 130 includes a diode 146, an inductor 148, and a short circuit switch 152. Inductor 148 and short circuit switch 152 are connected in series between positive winding 140 and ESM positive 126, and therethrough to a positive terminal (shown in FIG. 2) of ESM 124 (shown in FIG. 2). Diode 146 is connected between ESM negative lead 128 and ESM positive lead 126, connects to ESM negative lead 128 through short circuit switch 152, connects to positive winding 138 through inductor 148, and is arranged to oppose current flow through diode 146 to ESM negative lead 128. Controller 112 (shown in FIG. 2) is operably connected to short circuit switch 152 through a control lead 160 for controlling connectivity of ESM 124 to power bus 18 during operation.

As will be appreciated by those of skill in the art in view of the present disclosure, when a short circuit occurs on the power bus to which first power stage 102 is connected, the bus voltage drops to the voltage of the ESM 124, and as such ESM 124 will source maximum current to the power bus. Short circuit switch 152 limits current flow from ESM 124 in the event of a short circuit on the power bus by acting as a buck regulator. This causes power stage 102 to source a predetermined amount of current for a predetermined period of time to attempt clearing the short circuit fault from the power bus.

With continuing reference to FIG. 2, second power stage 104 is similar to first power stage 102 and additionally includes a power filter 154, a DC/DC converter 156 and an ESM 158. ESM 158 can include one or more of a battery and a capacitor, such as a supercapacitor or ultracapacitor, and is configured an adapted to source/absorb transient current pulses flowing through negative rail 34 through negative rail lead 108 via DC/DC converter 156 and power filter 154. DC/DC converter 156 electrically connects ESM 158 to power filter 154. Power filter 154 electrically connects DC/DC converter 156 to neutral rail lead 110 through second leg 118 and negative rail lead 108.

In certain embodiments ESM 158 and ESM 124 (shown in FIG. 2) are of a common type. In this respect ESM 158 and ESM 124 can both be, for example, ultracapacitors to handle repetitive loads or batteries for energy dense loads, for example. In accordance with certain embodiments the HESM can include two or more sets of power stages paralleled together to connect with the power bus, the first set or power stages having ESM's of a first type stacked in series, the second set of power stages having ESM's of a second type stacked in series.

Figure 4:
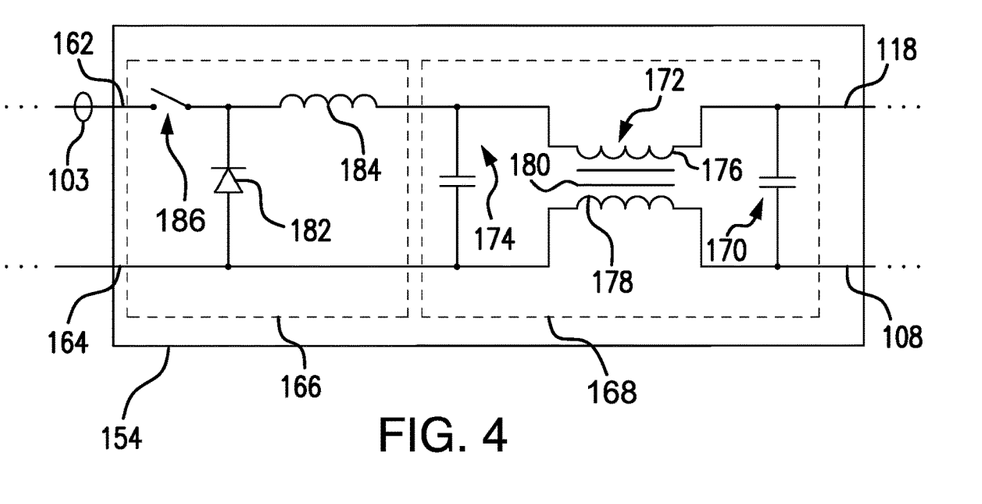
FIG. 4 is a schematic view of another portion of the HESM system of FIG. 1, showing a power filter of a second power stage including a second power stage short circuit switch.

With reference to FIG. 4, power filter 154 is shown. Power filter 154 is similar to power filter 120 (shown in FIG. 3) and is additionally arranged for sourcing/absorbing current pulses (shown in FIG. 2) to negative rail 34 and neutral rail 32. In this respect power filter 154 includes an ESM positive lead 162, an ESM negative lead 164, a switch circuit 166, and a filter circuit 168. Filter circuit 168 connects negative rail lead 108 and second leg 118 of neutral rail lead 110 to ESM 158 (shown in FIG. 2) and has a first capacitor 170, a differential filter inductor 172 and a second capacitor 174. First capacitor 170 is connected between second leg 118 of neutral rail lead 110 and negative rail lead 108. Second capacitor 174 is connected between ESM positive lead 162 and ESM negative lead 164.

Differential filter inductor 172 has a neutral winding 176, a negative winding 178 and a ferrite core 180. Neutral winding 176 is connected in series between ESM positive lead 162 and second leg 118 of neutral rail lead 110 and is electromagnetically coupled to negative winding 178 via ferrite core 180. Negative winding 178 is connected in series between negative rail lead 108 and neutral rail lead 110 and is electromagnetically coupled to neutral winding 176 via ferrite core 180.

Switch circuit 166 includes a diode 182, an inductor 184, and a short circuit switch 186. Inductor 184 and short circuit switch 186 are connected in series between neutral winding 176 and ESM positive lead 162, and therethrough to a positive terminal (shown in FIG. 2) of ESM 158 (shown in FIG. 2). Diode 182 is connected between ESM positive lead 162 and ESM negative lead 164, connects to ESM positive lead 162 through short circuit switch 186, connects to neutral winding 176 through inductor 184, and is arranged to oppose current flow through diode 182 to ESM negative lead 164.

As will be appreciated by those of skill in the art in view of the present disclosure, because first power stage 102 (shown in FIG. 2) and second power stage 104 are stacked in series, mismatch in efficiency of first power stage 102 and second power stage 104 can cause the state of charge of one of first power stage 102 and second power stage 104 to diverge from the stage of charge of the other of first power stage 102 and second power stage 104 during continuous operation, i.e., when absorbing/sourcing pulses on power bus 18 (shown in FIG. 2). The divergence can accumulate to point where the divergent power stage exceeds predetermined overvoltage limit—at which point the power stage is disconnected from power bus 18 for service. To avoid such overvoltage fault conditions HESM system 100 includes controller 112. Controller (shown in FIG. 2) has a balancing mode wherein one of first power stage 102 and second power stage 104 are connected to power bus 18 through the other of first power stage 102 and second power stage 104 to dissipate charge to maintain state of charge of first power stage 102 and second power stage 104 below the overcharge limit.

With continuing reference to FIG. 2, controller 112 includes an interface 188, a processor 190, and a memory 192. Memory 192 includes a non-transitory machine readable medium and includes a plurality of program modules 194 having instructions recorded thereon that, when read by processor 190, cause processor to undertake certain actions, e.g., steps of a method 300 (shown in FIG. 5) for controlling connectivity of HESM system 100 to power bus 18. More particularly, controller 112 is configured to open and close short circuit switch 152 and short circuit switch 186 according to switch states 210-240 (shown in FIG. 5). More particularly, based on whether an input 194/196/198 is received at interface 188, controller configures HESM system 100 in (a) absorb/source mode 210, (b) a short detected mode 220, (c) a discharge mode 230, or a (d) balance mode 240.

Figure 5:
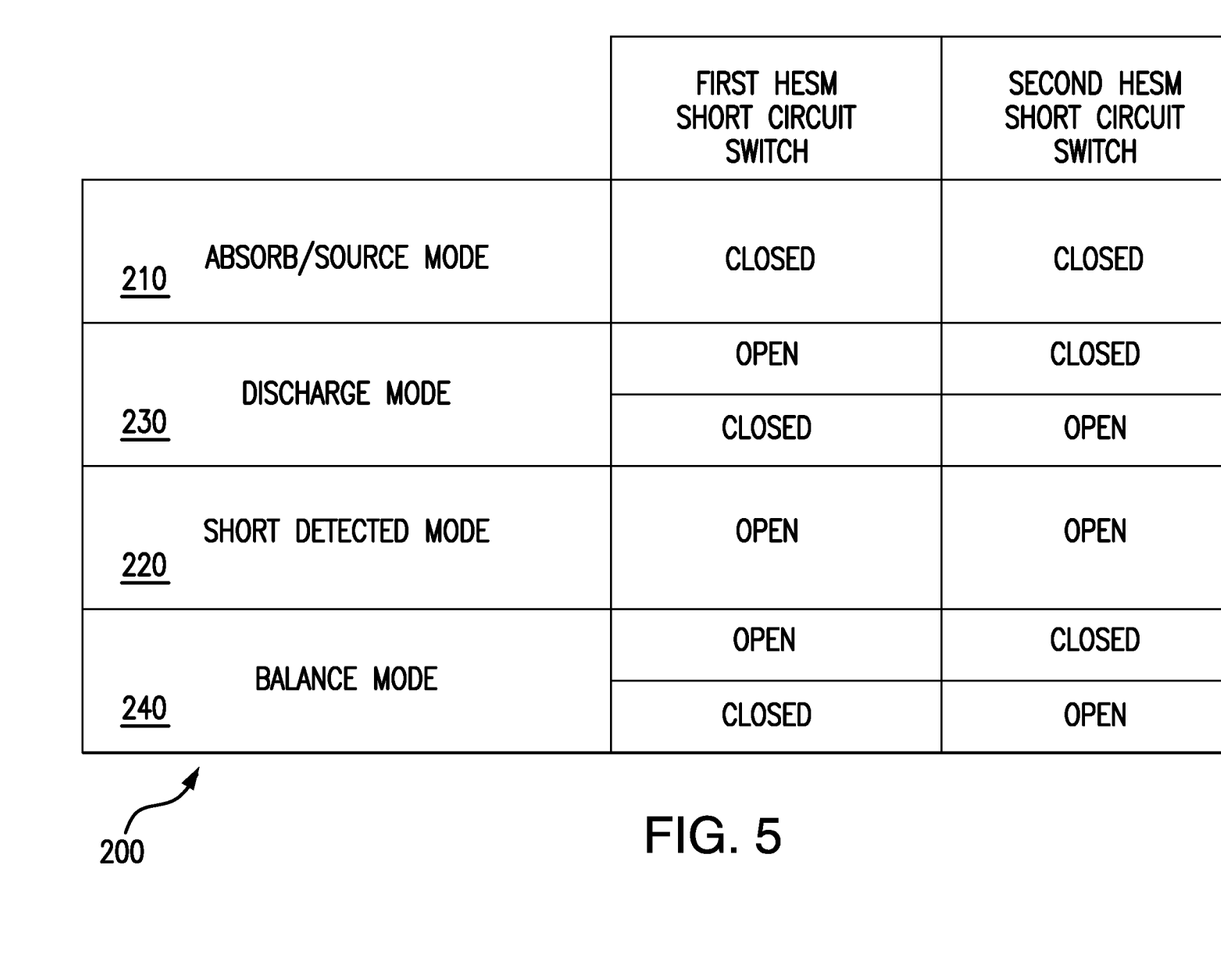
FIG. 5 is a table of short circuit switch settings selectable by the controller of the HESM system of FIG. 1, showing short circuit switch settings in absorbing/sourcing mode, a short circuit detected mode, a power stage discharge mode, and a power stage balancing mode.

With reference to FIG. 5, switch states of HESM system 100 are shown for (a) absorb/source mode 210, (b) a short detected mode 220, (c) a discharge mode 230, or a (d) balance mode 240. Absent receipt of input 194/196/198 at interface 188 controller configures HESM system 100 in absorb/source mode 210. In the absorb/source mode 210 short circuit switch 152 and short circuit switch 186 in an electrically closed state. Closure of short circuit switch 152 places ESM 124 in electrical communication with positive rail 30 and neutral rail 32 to absorb/source current pulses flowing through positive rail 30, thereby regulating voltage across positive rail 30 and neutral rail 32, HESM system 100 thereby actively filtering of split HVDC power bus 18 by sourcing and absorbing current pulses from HVDC power bus 18 as required during operation.

When a shorted detected input 195 is received at interface 188 controller 112 configures HESM system 100 in short detected mode 220. More particularly, in short detected mode 220, controller 112 electrically opens both short circuit switch 152 and short circuit switch 186 opened. Opening short circuit switch 152 and short circuit switch 186 disconnects both ESM 124 and ESM 158 of first power stage 102 and second power stage 104, limiting (or eliminating entirely) current flow from HESM system 100 when a short circuit is detected on power bus 18. This can be done, for example, by applying a pulse-width modulated signal from controller 112 such that controller 112 operates as a hysteresis current regulator. For example, controller 112 can regulate current flow of a predetermined amount for a predetermined duration prior to opening the short circuit switches following an unrecoverable fault, e.g., 300 amps for 5 seconds).

When a discharge input 196 is received at interface 188 controller 112 configures HESM system 100 in discharge mode 230. More particularly, controller 112 discharges one of first power stage 102 and second power stage 104 through the other of first power stage 102 and second power stage 104 by operating of short circuit switch 152 (shown in FIG. 3) and short circuit switch 186 (shown in FIG. 4). For example, when discharge input 196 indicates that ESM 124 of first power stage 102 is to be discharged controller 112 electrical opens short circuit switch 186, disconnecting ESM 158 from power bus 18, and electrically closes short circuit switch 152, connecting ESM 124 to power bus 18. As will be appreciated by those of skill in the art in view of the present disclosure, opening short circuit switch 186 while short circuit switch 152 is closed causes the discharge of ESM 124 of first power stage 102 through power filter 154 of second power stage 104.

Similarly, when discharge input 196 indicates that ESM 158 of second power stage is to be discharged, controller 112 electrically closes short circuit switch 186 and electrically opens short circuit switch 152 to discharge ESM 158 through power filter 120 of first power stage 102. Under either condition it is contemplated that controller 112 cause the ESM associated with discharge input 196 to discharge substantially in full through power bus 18, such as for maintenance by way of non-limiting example.

When an overcharge detected input 197 is received at interface 188 controller 112 configures HESM system 100 in balance mode 240. More particularly, controller 112 discharges one of first power stage 102 and second power stage 104 through the other of first power stage 102 and second power stage 104 by operating of short circuit switch 152 (shown in FIG. 3) and short circuit switch 186 (shown in FIG. 4). For example, when overcharge detected input 197 indicates that ESM 124 of first power stage 102 is overcharged, controller 112 electrical opens short circuit switch 186, disconnecting ESM 158 from power bus 18 and electrically closes short circuit switch 152 to connect ESM 124 to power bus 18 to connect to ESM 124 of first power stage 102 through power filter 154 of second power stage 104. It is contemplated that, responsive to receipt of overcharge detected input 197, HESM system 100 retaining the switch settings for a relatively limited time interval, i.e., a time interval sufficient to return the charge of ESM 124 to within a predetermined charge limit and to not fully discharge ESM 124. Overcharge detected input 197 can be provided, for example, via a sensor 101 (shown in FIG. 3), coupled to ESM 124 and disposed in communication with controller 112, and/or a sensor 103 (shown in FIG. 4) coupled to ESM 158 (shown in FIG. 4) and disposed in communication with controller 112.

Similarly, when overcharge detected input 197 indicates that ESM 158 of second power stage is overcharged, controller 112 electrically closes short circuit switch 186 and electrically opens short circuit switch 152 to discharge ESM 158 through power filter 120 of first power stage 102, as shown in (d) balance mode 240 in table 200 (shown in FIG. 5). As above, it is contemplated that, responsive to receipt of overcharge detected input 197, HESM system 100 retain the switch settings for a relatively limited time interval, i.e., a time interval sufficient to return state of charge of the respective ESM to within a predetermined limit and to not fully discharge ESM 124.

Figure 6:
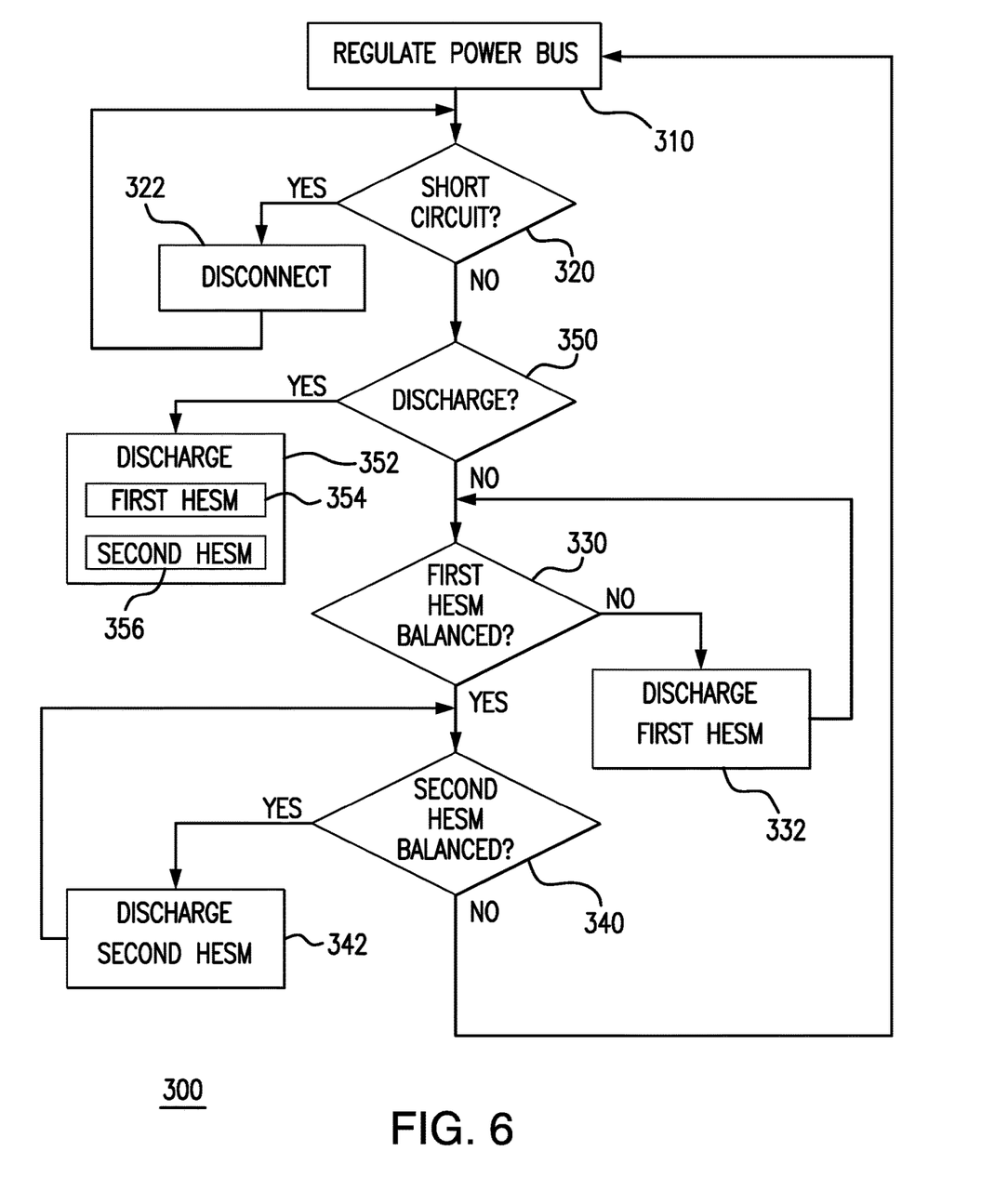
FIG. 6 is schematic diagram a method of controlling connectivity of the HESM system to the power bus system of FIG. 1, showing the steps of the method.

With reference to FIG. 6, a method 300 of controlling connectivity of an HESM system, e.g., HESM system 100 (shown in FIG. 1), to a power bus, e.g., power bus 18 (shown in FIG. 1), is shown. Method 300 includes absorbing/sourcing current pluses to the power bus with a first power stage and a second power stage, e.g., first power stage 102 and second power stage 104, to regulated the power bus, as shown by box 310. Absorbing/sourcing pulses to the power bus can include closing both a first power stage short circuit switch and a second power stage short circuit switch, e.g., first power stage short circuit switch 152 and second power stage short circuit switch 186, as shown in (a) absorb/source mode 210 in table 200 (shown in FIG. 5). Absorbing/sourcing can occur while the HESM system actively regulates current flow through the power bus, the HESM system regulating current flow through the power bus as a hysteresis current flow regulator.

Method 300 also includes disconnecting the HESM system from the power bus upon detecting a short circuit on the power bus, as shown by box 320. Disconnecting can include disconnecting the first power stage and the second power stage upon detection of a short circuit on the power bus, as shown in (b) short detected mode 220 in table 200 (shown in FIG. 5) For example the first power stage short circuit switch and/or the second power stage short circuit switch can be opened as shown by box 322.

Method 300 additionally includes balancing SOC within the HESM system by determining whether the first power stage is overcharged, as shown with box 330. Balancing SOC within the HESM system includes connecting the first power stage to the power bus through the second power stage, as shown with box 332. In this respect the second power stage short circuit switch is opened an the first power stage short circuit switch closed such that the first power stage is connected to a negative rail, e.g., negative rail 34 (shown in FIG. 2), of the power bus through the second power stage, as reflected in the second row of (d) balance mode 240 in table 200 (shown in FIG. 5).

Balancing SOC the HESM system can include connecting the second power stage to the power bus through the first power stage, as shown with box 340. In this respect the first power stage short circuit switch can be opened an the second power stage short circuit switch closed such that the second power stage is connected to a positive rail, e.g., positive rail 30 (shown in FIG. 2), of the power bus through the second power stage, as shown with box 342, as reflected in the first row of (d) balance mode 240 in table 200 (shown in FIG. 5). It is contemplated that the balancing SOC include partially discharging one of the first and second power stage to within a predetermined limit to prevent overcharging of an ESM to accumulate such that the ESM need be taken off-line for maintenance.

Method 300 further includes discharging either (or both) the first power stage and second power stage, in full, as shown with box 350. Discharging either (or both) the first power stage and the second power stage includes connecting the first power stage to the power bus through the second power stage, as shown with box 352. In this respect the second power stage short circuit switch is opened an the first power stage short circuit switch closed such that the first power stage is connected to the negative rail of the power bus through the second power stage, as indicated in the second row of (c) discharge mode 230 in table 200 (shown in FIG. 5).

Discharging either (or both) the first power stage and the second power stage can also include connecting the second power stage to the power bus through the first power stage, as shown with box 354. In this respect the first power stage short circuit switch can be opened an the second power stage short circuit switch closed such that the second power stage is connected to the positive rail of the power bus through the second power stage, as shown with box 356, as indicated in the first row of (c) discharge mode 230 in table 200 (shown in FIG. 5). It is contemplated that the balancing state of charge include fully discharging at least one of the first and second power stage.

The methods and systems of the present disclosure, as described above and shown in the drawings, provide HESM systems, electrical systems with HESM systems, and methods for controlling connectivity to HESM system power stages to electrical systems with superior properties including the capability to balance either (or both) the state of charge power stages stacked in series with the electrical system. In certain embodiments capability is also provided to discharge either (or both) the power stages, such as for maintenance. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A hybrid storage module (HESM) system, comprising:
a first power stage with a short circuit switch to connect the first power stage to a power bus, the first power stage connected between a positive rail and a neutral rail;
a second power stage stacked in series with the first power stage with a short circuit switch to connect the second power stage to the power bus, the second power stage connected between a negative rail and the neutral rail; and
a controller operably connected to the first power stage short circuit switch and the second power stage short circuit switch, wherein the controller has state of charge (SOC) balance mode and a discharge mode, wherein when in the SOC balance mode the controller is configured to discharge one of the first power stage and the second power stage by connecting one of the first and second power stages through the other of the first and second power stage with the other of the first and second power stage disconnected from the power bus, and when in the discharge mode the controller is configured to discharge either (or both) the first power stage and the second power stage through the power bus, and
one of the first power stage short circuit switch and the second power stage short circuit switch is closed in the SOC balancing mode, and wherein the other of the first power stage short circuit switch and the second power stage short circuit switch is open in the SOC balancing mode.

2. The HESM system as recited in claim 1, wherein one of the first power stage short circuit switch and the second power stage short circuit switch is closed in the SOC balancing mode.

3. The HESM system as recited in claim 1, wherein one of the first power stage short circuit switch and the second power stage short circuit switch is open in the SOC balancing mode.

4. The HESM system as recited in claim 1, wherein one of the first power stage short circuit switch and the second power stage short circuit switch is closed in the SOC balancing mode, and wherein the other of the first power stage short circuit switch and the second power stage short circuit switch is open in the SOC balancing mode.

5. The HESM system as recited in claim 1, wherein the controller has a short circuit mode to disconnect an energy storage module (ESM) of the first power stage and an ESM of the second ESM from the power bus.

6. The HESM system as recited in claim 5, wherein both the first power stage short circuit switch and the second power stage short circuit switch are open in the short circuit mode.

7. The HESM system as recited in claim 1, wherein the controller has an absorb/source mode to absorb and provide current pulses to the power bus.

8. The HESM system as recited in claim 7, wherein both the first power stage short circuit switch and the second power stage short circuit switch are closed in the absorb/source mode.

9. The HESM system as recited in claim 1, further comprising:
a power bus having the negative rail, a neutral rail, and the positive rail;
a positive rail lead connecting the first power stage to the positive rail;
a negative rail lead connecting the second power stage to the negative rail; and
a neutral rail lead connecting the first power stage and the second power stage to the neutral rail through a y-lead.

10. The HESM system as recited in claim 1, wherein the first power stage comprises:
an energy storage module (ESM);
a direct current/direct current (DC/DC) converter connected in series to the ESM; and
a power filter connected in series to the DC/DC converter; and
a neutral lead connecting the power filter to the second power stage.

11. The HESM system as recited in claim 10, wherein the power filter includes a differential filter inductor circuit connected to a switch circuit having the short circuit switch.

12. The HESM system as recited in claim 10, wherein the power filter comprises:

a positive ESM lead and a negative ESM lead;
an inductor connected to the positive ESM lead by the short circuit switch; and
a diode connecting the negative ESM lead to a node between the inductor and the short circuit switch, the diode arranged to oppose current flow from the positive ESM lead to the negative ESM lead.

13. The HESM system as recited in claim 1, wherein the first power stage includes a supercapacitor, a fuel cell, or a battery.

14. The HESM system as recited in claim 1, wherein the second power stage comprises an energy storage module (ESM), a direct current/direct current (DC/DC) converter connected in series to the ESM, and a power filter connected in series to the DC/DC converter; and
a neutral lead connecting the power filter to the second power stage.

15. An electrical system for an aircraft comprising a power bus with a positive rail, a negative rail, and a neutral rail; and a HESM system as recited in claim 1, the first power stage connected to the positive rail and the neutral rail, the second power stage connected to the negative rail and the neutral rail.

16. A method of controlling connectivity of a hybrid energy storage module (HESM) to a power bus, comprising:
at a HESM system including a first power stage with a short circuit switch to connect the first power stage to a power bus, a second power stage with a short circuit switch to connect the second power stage to the power bus, and a controller operably connected to the first power stage short circuit switch and the second power stage short circuit switch;
absorbing/sourcing current flow to the power bus from the first and second power stage; and
balancing state of charge between the first power stage and the second power stage by connecting one of the first and second power stage through the other of the first and second power stage with the other of the first and second power stage disconnected from the power bus including operating in a state of charge (SOC) balance mode and a discharge mode, wherein operating in the SOC balance mode includes discharging one of the first power stage and the second power stage by connecting one of the first and second power stages through the other of the first and second power stage with the other of the first and second power stage disconnected from the power bus, and wherein operating in the discharge mode includes discharging either (or both) the first power stage and the second power stage through the power bus,
wherein one of the first power stage short circuit switch and the second power stage short circuit switch is closed in the SOC balancing mode, and wherein the other of the first power stage short circuit switch and the second power stage short circuit switch is open in the SOC balancing mode.

17. The method as recited in claim 16, further comprising disconnecting the first and second power stage from the power bus responsive to detecting a short circuit in the power bus.

18. The method as recited in claim 16, further comprising discharging, in full, at least one of the first and second power stage by connecting one of the first and second power stage through the other of the first and second power stage with the other of the first and second power stage disconnected from the power bus.

* * * * *